United States Patent [19]

Sibata et al.

[11] Patent Number: 5,508,257

[45] Date of Patent: Apr. 16, 1996

[54] SUPERCONDUCTING COMPOSITE

[75] Inventors: Kenichiro Sibata; Takeshi Yamaguchi; Shuji Yazu; Tetsuji Jodai, all of Hyogo, Japan

[73] Assignee: Sumitomo Electric Industries, Ltd., Osaka, Japan

[21] Appl. No.: 197,564

[22] Filed: Feb. 17, 1994

Related U.S. Application Data

[63] Continuation of Ser. No. 106,780, Aug. 16, 1993, abandoned, which is a continuation of Ser. No. 735,765, Jul. 29, 1991, abandoned, which is a continuation of Ser. No. 176,119, Mar. 31, 1988, abandoned.

[30] Foreign Application Priority Data

Mar. 31, 1987  [JP]  Japan ................................. 62-77936
Mar. 31, 1987  [JP]  Japan ................................. 62-77937
Mar. 31, 1987  [JP]  Japan ................................. 62-77938

[51] Int. Cl.$^6$ ............................. H01B 1/14; H01B 12/00
[52] U.S. Cl. ..................... 505/452; 505/124; 505/490; 505/785; 428/930; 419/6; 419/19
[58] Field of Search ............... 505/1, 785, 778, 505/779, 124, 452, 490; 252/62.53; 501/134, 123; 419/6, 19; 427/62, 431, 443.2, 404; 429/930

[56] References Cited

U.S. PATENT DOCUMENTS

| | | | |
|---|---|---|---|
| 3,718,441 | 2/1973 | Landingham | 29/182.1 |
| 3,796,553 | 3/1974 | Daunt | 29/191.2 |
| 3,815,224 | 6/1974 | Pickus et al. | 29/599 |
| 4,050,147 | 9/1977 | Winter et al. | 29/599 |
| 4,717,627 | 1/1988 | Nellis et al. | 428/552 |
| 4,725,567 | 2/1988 | Hillig | 501/87 |
| 4,762,754 | 8/1988 | Nellis et al. | 428/552 |
| 4,770,701 | 9/1988 | Henderson et al. | 75/232 |
| 4,826,808 | 5/1989 | Yurek et al. | 505/1 |
| 4,892,861 | 1/1990 | Ray | 505/1 |
| 4,906,609 | 3/1990 | Yamauchi et al. | 505/1 |
| 5,011,822 | 4/1991 | Barder | 505/778 |
| 5,262,398 | 11/1993 | Nagata et al. | 505/1 |

FOREIGN PATENT DOCUMENTS 2219133  2/1973  France.

OTHER PUBLICATIONS

"Y—Ba—Cu—O/Nb Tunnel Type Josephson Junctions" Inoue et al.–Jap. J. of App. Phys vol 26 #9 Sep. 1987 pp. L1443–L1444.

*The Economist*, "Science and Technology" pp. 87–88 Feb. 21, 1987.

"Breakthrough Seen in Magnet Research"–Wednesday Mar. 12, 1987–James Gleick.

*Introduction to the Priciples of Ceramic Processing*, James S. Reed p. 44–, ©1988 Wiley & Sons.

"Antiferromagnetic Ordering in Y—Ba—Cu—Pt—O"Int. J. of Mod. Phys. B vol. 1, No. 2 (1987) 479–484 Kovachev et al. no month.

"Superconducting Properties of Y—Ba—Cu—Pt—O" Int. J. of Mod. Phys. B vol. 1, No. 2 (1987) pp. 223–229 no month.

Bednorz, et al, "Possible High $T_c$ Superconductivity in the Ba—La—Cu—O System", Z. Phys. B—Condensed Matter 64, pp. 189–193 (1986) no month.

Physical Review Letters, vol. 58, No. 4, 26 Jan 87, New York, U.S. pp. 408–410; R. J. Cava et al.: "Bulk superconductivity at 36K in $La_{1.8}Sr_{0.2}CuO_4$" p. 408.

(List continued on next page.)

*Primary Examiner*—C. Melissa Bonner
*Attorney, Agent, or Firm*—Foley & Lardner

[57] ABSTRACT

Superconducting composite comprising a matrix made of superconducting sintered mass composed of perovskite type or quasi-perovskite type oxide and metal phase dispersed in the superconducting mass with a proportion of from 10 to 70 volume % with respect to said composite. The metal phase may consist of at least one of Cu, Ag, Au, Pt, Ni and Zn or their alloys. The superconducting sintered mass may be Ba-Y-Cu-O type compound oxide.

12 Claims, 1 Drawing Sheet

OTHER PUBLICATIONS

Journal of the Electrochemical Society, vol. 134, No. 10, Oct. 1987, Manchester New Hampshire, pp. 2635–2636. G. J. Yurek et al.: "Direct synthesis of a metal/superconducting oxide composite by oxidation of a mettalic precursor." Applied Physics Letters, vol. 48, No. 26, 30 Jun. 1986, NY, U.S., pp. 1808–1810, S. Pourrahimi et al.: "Nb3Sn(Ti) powder metallurgy processed high field superconductors", the whole document.

Goyal et al, "Cermets of the $Y_1Ba_2Cu_3O_{7-\gamma}$ Superconductors"; *Mat'l Lett.*, vol. 6, No. 8.9; May 1988, pp. 257–260.

Takita et al, "Superconductivity Transition in High-$T_c$ Y–Ba–Cu–O Mixed–Phase System", *Jap Jour Appl Phy*, vol. 26, No. 4; Aug. 1987, pp. L506–L507.

Hatano et al "Identification of Phases in High $T_c$ Oxide Superconductor $Ba_{0.7}Y_{0.3}Cu_1O_x$", *Jap Jour Appl Phy;* vol. 26, No. 4; Apr. 1987, pp. L374–L376.

Sun et al, "Superconductivity and Magnetism in the High-$T_c$ Superconductor Y—Ba—Cu—O", *Phy Rev Lett*, vol. 8, No. 15, Apr. 13, 1987, pp. 1574–1576.

SUPERCONDUCTING COMPOSITE

This application is a continuation of application Ser. No. 08/106,780, filed on Aug. 16, 1993, now abandoned, which is a FWC of Ser. No. 07/735,765, filed on Jul. 29, 1991, now abandoned, which is a FWC of Ser. No. 07/176,119, filed on Mar. 31, 1988, now abandoned.

BACKGROUND OF THE INVENTION

1. Field of the Invention

The present invention relates to a superconducting composite and a process for preparing the same, more particularly, it relates to a superconducting composite which can make good use of superconductivity which exhibits a higher critical temperature and a process for producing the same.

2. Description of the Related Art

Under the superconducting condition, the perfect aliamagnetism is observed and no difference in potential is observed for all that an electric current of a constant finite value is observed internally, and hence, a variety of applications of superconductivity have been proposed in a field of electric power transmission as a mean for delivering electric power without loss.

The superconductivity can be utilized in the field of power electric applications such as MHD power generation, power transmission, electric power reservation or the like; in the field of transportation for example magnetic levitation trains, or magnetically propelling ships; in the medical field such as high-energy beam radiation unit; in the field of science such as NMR or high-energy physics; a high sensitive sensors or detectors for sensing very weak magnetic field, microwave, radiant ray or the like, or in the field of fusion power generation.

In addition to the abovementioned power electric applications, the superconducting materials can be used in the field of electronics, for example, as a josephson device which is an indispensable switching device for realizing a high-speed computer which consumes very reduced power.

However, their actual usage have been restricted because the phenomenon of superconductivity can be observed only at very low cryogenic temperatures. Among known superconducting materials, a group of materials having so-called A-15 structure show rather higher Tc (critical temperature of superconductivity) than others, but even the top record of Tc in the case of $Nb_3Ge$ which showed the highest Tc could not exceed 23.2K at most. This means that liquidized helium (boiling point of 4.2K) is only one cryogen which can realize such very low temperature of Tc. However, helium is not only a limited cosily resource but also require a large-scaled system for liquefaction. Therefore, there had been a strong demand for another superconducting materials having higher Tc. But no material which exceeded the abovementioned Tc had been found for all studies for the past ten years.

Possibility of existence of a new type of superconducting materials having much higher Tc was revealed by Bednorz and Müller who discovered a new oxide type superconductor in 1986 [Z. Phys. B64 (1986)189]

This new oxide type superconducting material is [La, $Ba]_2CuO_4$ or [La, $Sr]_2CuO_4$ which are called as the $K_2NiF_4$-type oxide having a crystal structure which is similar to known perovskite type oxide. The $K_2NiF_4$-type oxides show such higher Tc as 30 to 50K which are extremely higher than the known superconducting materials and hence it becomes possible to use liquidized hydrogen (b.p.=20.4K) or liquidized neon (b.p.=27.3K) as a cryogen which brag them to exhibit the superconductivity.

It was also reported in the news pater that C. W. Chu et al discovered in the Untied States of America another type of superconducting material having the critical temperature of in the order of 90K in February 1987, and hence possibility of existence of high-temperature superconductors have burst on the scene.

However, the above mentioned new type superconducting materials which was just born have been studied and developed only in a form of sintered bodies as a bulk produced from powders and hence is very fragile, so that careful handling is requested. In fact, they are apt to break or crack easily under mechanical stress, particularly, when they are shaped into a wire form.

It is difficult to produce a slatered body composed of completely uniform polycrystal possessing higher superconductivity from particles having superconducting properties alone. Still more, the superconductivity is apt to be easily broken in stronger magnetic field or fluctuation and/or unhomogeneous distribution of temperature in the sintered body.

The abovementioned oxide type superconducting materials possess rather higher specific resistance and lower heat-conductivity above the critical temperature. Therefore, if the phenomenon of superconductivity breaks locally, the sintered body generates locally Joule heat caused by the superconducting current and explosive evaporation of cryogen is induced when the heated portion of the sintered body contacts with the cryogen. In order to avoid this trouble, in conventional metal type superconducting material, superconducting metal is shaped in a form of a fine wire and a plurality of which are embedded in electroconductive material which play a roll of a by-pass of electric current.

The oxide type superconducting materials are, however, difficult to be shaped or deformed into such filaments, because they have not superior plasticity or processability in comparison with well-known metal type superconducting materials such as Ni-Ti alloy.

Therefore, an object of the present invention is to overcome the abovementioned problems and to provide a new superconducting composite which can be used under more stable conditions safely and a process for producing the same.

SUMMARY OF THE INVENTION

The present invention provides an improved superconducting composite comprising a superconducting sintered mass composed of perovskite type or quasi-perovskite type oxide having a composition represented by the general formula:

$$\alpha_w \beta_x \gamma_y \delta_z$$

in which,

"α" a represents one element selected from a group consisting of elements of IIa group of the Periodic Table, "β" represents one element selected from a group consisting of elements of IIIa group of the Periodic Table, "γ" represents one element selected from a group consisting of elements of Ib group, IIb group, IIIb group and VIII group of the Periodic Table, "δ" represents at least one element selected from a group consisting of oxygen (O), boron (B), carbon (C), nitrogen (N), fluorine (F) and sulfur (S), and each of "w", "x" and "y" represents a number which is not zero but is less than 1, and "z" represents a number which is selected from a range of from 1 to 5, and, metal phase dispersed in said superconducting mass with a proportion of from 10 to 70 volume % in the composites.

Namely, the essence of the present invention resides in such a structure that electroconducting metal particles possessing higher heat conductivity and higher specific heat than a surrounding sintered mass or matrix composed of superconducting sintered oxide are dispersed in the latter.

Therefore, even if the superconductivity break accidentally, electric current pass trough the metal particles dispersed in the superconducting sintered oxide body so that excessive local heat generation cause by breakage of superconductivity become avoidable. Still more, the heat generated by Joule heat can be dispersed effectively because the metal phase possess superior heat conductivity. Particularly, locally defined minute breakage of superconductivity may be annulled self-adjustably and hence the composite according to the present invention has a function for stabilizing the superconductivity.

Further more, the composite according to the present invention shows improved mechanical strength and malleability, so that metal working for producing elongated articles such as red, wire or a varied of parts of superconducting material can be facilitated and also the products possess improved mechanical strength. Namely, such disadvantages of sintered body as poor mechanical strength or fragility can be compensated with the metal phase which has higher resistance to plastic deformation and which is filled in pores in the sintered body.

The performance as superconductivity of the abovementioned composite according to the present invention is not spoiled by the presence of metal particles dispersed in the superconducting sintered body because the continuity of the sintered body itself is not lost.

In practice, the metal phase may be consist of at least one of metals of Cu, Ag, Au, Pt, Ni and Zn or their alloys. Copper or copper alloys may be preferably selected for the reason of economy and stability of electric current, while Pt, Au, Ag which possessing smaller values of Free energy of oxide formation may be selected in order to prevent oxidation of the metal particles.

The oxide which compose superconducting sintered body is preferably compound oxides in which said element "α" is selected from a group consisting of Ba, Sr, Ca, Mg or Be and said element "β" is selected from a group consisting of Y, La, Sc, Ce, Gd, Ho, Er, Tm, Yb, Lu or the like. The element "γ" is preferably copper and the element "δ" is oxygen (O).

The volumetric percentage of the metal phase in the compact is preferably from 10 to 70%. When the percentage of the metal phase is not higher than 10%, the effect for stabilizing the superconducting condition can not be expected because of inadequate heat-absorption capacity of the metal phase. To the contrary, if the percentage exceeds 70% higher current density of superconducting as a bulk can not be obtained because the continuity of superconducting phase in the sintered body can not be maintained.

According to another preferred aspect of the present invention, platinum (Pt) is preferably used as the metal phase or as a protective coating layer of the metal particles, since the abovementioned sintered oxide is apt to be reduced when it is contacted with the metal and lost the superconducting property.

It is also preferable to oxidize the surface of the metal particles previously in order to prevent the abovementioned reduction by the metal phase. For example, when the copper is used as metal particle of the metal phase, the copper particles are preferably surface-treated to form a surface layer of CuO or $Cu_2O$.

The present invention also provides a process for producing the abovementioned superconducting composite.

Namely, the process according to the present invention for producing the composite comprising a superconducting sintered mass composed of perovskite type or quasi-perovskite type oxide having a composition represented by the general formula:

$$\alpha_w\beta_x\gamma_y\delta_z$$

in which,

"α" represents one element selected from a group consisting of elements of IIa group of the Periodic Table, "β" represents one element selected from a group consisting of elements of IIIa group of the Periodic Table, "γ" represents one element selected from a group consisting of elements of Ib group, IIb group, IIIb group and VIII group of the Periodic Table, "δ" represents at least one element selected from a group consisting of oxygen (O), boron (B), carbon (C), nitrogen (N), fluorine (F) and sulfur (S), and each of "w", "x" and "y" represents a number which is not zero but is less than 1, and "z" represents a number which is selected from a range of from 1 to 5, and oxygen (O), and, metal phase dispersed in said superconducting mass with a proportion of from 10 to 70 volume % with respect to said superconducting mass, characterized by preparing a powder mixture comprising a powder of oxide or carbonate of said element "α", a powder of oxide or carbonate of said element "β" and a powder of oxide or carbonate of said element "γ" in such proportions that the atom ratio of said elements "α":"β":"γ" is adjusted to w:x:y, wherein, each of "w", "x" and "y" represent numbers which is not zero but is less than 1, subjecting the powder mixture to preliminary sintering, pulverizing a preliminary sintered mass, admixing metal powder with the resulting pulverized powder, compacting the resulting metal containing powder mixture into a shaped body, and subjecting the shaped body to the final sintering.

It is supposed that the critical temperature of superconductivity can be improved when the size of crystal grains is reduced to increase the total mount of the grain boundaries. Therefore, it is preferable that the sintered mass which constitute the skeleton of the superconducting composite have as finer crystal structure as possible. In practice, the material powder to be sintered previously have preferably a particle size of less than 5 μm. When the particle size of the material powder exceeds 5 μm, the crystal grains in the finally sintered body can not Re reduced to desired dimension, more precisely the particle size of the sintered mass will have an average particle size of more than 6 μm, resulting in deterioration of superconductivity. To the contrary, larger crystal grains which exceed 10 μm reduce the total mount of the grain boundaries. The decrease of the grain boundaries is not preferable to improve the critical temperature, since it is supposed that the superconductors of the perovskite type oxide or quasi-perovskite type oxide exhibit its improved property particularly in the neighborhood of its grain boundaries.

The sequence of preliminary sintering, pulverization and compacting to the shaped body is preferably repeated for several times in order to proceed solid solution reaction of the material powder or the preliminary sintered mass. It is also preferable to pulverize the preliminary sintered powder into finer crystal grains. The sequence of preliminary sintering, pulverization and compacting to the shaped body is preferably repeated for three times.

The temperature of the final sintering is a very critical factor to achieve higher critical temperature of superconductivity so that the temperature is controlled to satisfy such conditions that the sintering is proceed in solid phase reaction and that excessive crystal growth of perovskite type or quasi-perovskite type oxide do not occur.

Therefore, it is preferable that the final sintering is carried out at a temperature selected in a range of from 800° to 1,000° C. Namely, if the sintering temperature is not higher than 800° C., the sintered product obtained shows very low mechanical strength. To the contrary, if the sintering temperature exceeds 1,000° C., liquid phase is produced during the sintering operation or larger crystal grains are produced, resulting in lowering the Tc of the sintered body.

Because of the same reason as above, the preliminary sintering is preferably carried out at a temperature ranging from 700° C. to 950° C. When the temperature of the preliminary sintering is not higher than 700° C., satisfactory solid reaction do not proceed so that the desired crystal structure can not be obtained, while, if the preliminary sintering is carried out at a temperature which exceed 950° C., the resulting preliminary sintered mass contain solid solution phase or larger crystal grains which make it difficult to obtain finer crystal grains.

The abovementioned superconducting composite can be proceeded by another process described hereinafter.

Namely, the present invention provides another process for producing a superconducting composite comprising a superconducting sintered mass composed of perovskite type or quasi-perovskite type oxide having a composition represented by the general formula:

in which,

"α" represents one element selected from a group consisting of elements of IIa group of the Periodic Table, "β" represents one element selected from a group consisting of elements of IIIa group of the Periodic Table, "γ" represents one element selected from a group consisting of elements of Ib group, IIb group, IIIb group and VIII group of the Periodic Table, "δ" represents at least one element selected from a group consisting of oxygen (O), boron (B), carbon (C), nitrogen (N), fluorine (F) and sulfur (S), and each of "w", "x" and "y" represents a number which is not zero but is less than 1, and "z" represents a number which is selected from a range of from 1 to 5, and metal phase dispersed in said superconducting mass in a proportion of from 10 to 70 volume % with respect to said superconducting mass, characterized by preparing a powder mixture comprising a powder of oxide or carbonate of said element "α", a powder of oxide or carbonate of said element "β" and a powder of oxide or carbonate of said element "γ" in such proportions that the atom ratio of said elements "α":"β":"γ" is adjusted to w:x:y, wherein, each of "w", "x" and "y" represent numbers which is not zero but is less than 1, subjecting the powder mixture to preliminary sintering,
pulverizing a preliminary sintered mass,
compacting the resulting pulverized powder into a shaped body, subjecting the shaped body to the final statering, and then
dipping the sintered shaped body in molten metal so that a matrix of the sintered shaped body is impregnated with the metal.

In this second embodiment, a superconducting body produced by sintering, the abovementioned powder mixture in an oxygen containing atmosphere is dipped in molten metal.

The superconducting sintered body used in this embodiment is also preferably possess a finer crystal structure and hence the average particle size of the material powder to be subjected to the preliminary sintering step is preferably not larger than 5 μm. When the particle size of the material powder exceeds 5 μm, the crystal grains in the sintered body can not be reduced to desired dimension, more precisely the particle size of the finally sintered mass will have an average particle size of more than 6 μm, resulting in deterioration of superconductivity.

Because of the same reason as above, the average particle size of the powder to be subjected to the final sintering step is preferably smaller than 10 μm since larger crystal grains which exceed 10 μm reduce the total amount of the grain boundaries. Preferably the particles size of the pulverized material is less than 8 microns.

The conditions of preliminary sintering, pulverization, compacting and final sintering as well as selection of powder materials and metal phase are same as the abovementioned first embodiment.

In the second embodiment, the impregnation of the superconducting sintered body may be carried out by any conventional method such as dipping, spraying, coating or the like under ambient pressure or pressurized condition. It is also preferable to subject the sintered body to degassing or vacuum-treatment before impregnation in order to eliminate trapped gas out of pores in the sintered body so that molten metal can penetrate completely into the sintered body. On the same reason, the impregnation is preferably carried out under a pressurized condition.

Figure 1:
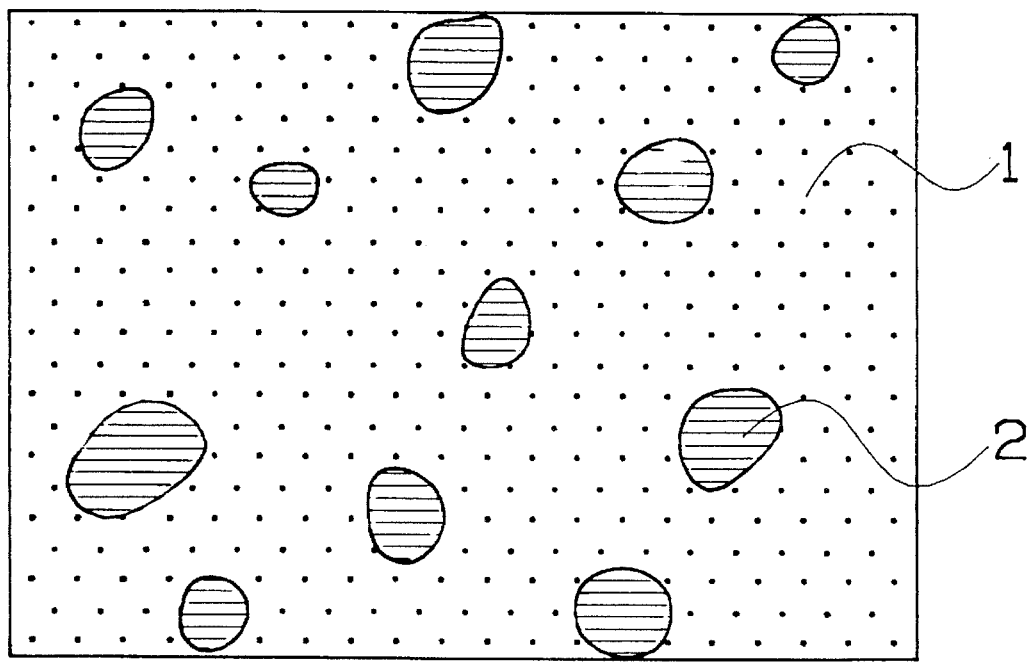
FIG. 1 is an illustrative drawing of the superconducting composite according to the present invention, showing a structure thereof.
Figure 2:
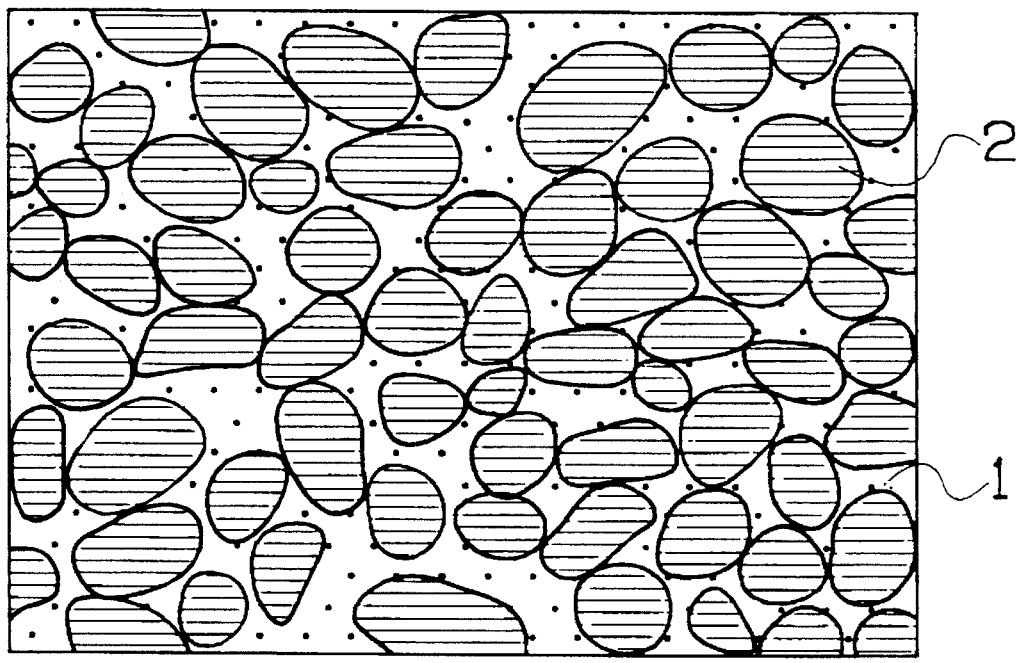
FIG. 2 is also another illustrative view of another type superconducting composite, showing a different structure thereof.

The typical structures of the superconducting composite according to the present invention are illustrated in FIG. 1 and FIG. 2.

In the first type shown in FIG. 1, a relatively smaller amount of the metal phase 2 is dispersed in a matrix consisting of superconducting sintered body 1. In this type, electric current can pass through the continuous sintered body 1 without breakage. This type of superconducting composite is realized when the volumetric percentage of the metal phase in the composite is in a rage of from 10 to 20%.

In the second type shown in FIG. 2, the volumetric percentage of the metal phase is increased to 60 to 70%, so that the mount of the metal phase 2 is larger than that of the sintered body. Even in this case, superconducting property can be maintained through the matrix of the superconducting sintered body 1 which extend three dimensionally.

Now, embodiments of the present invention will be described with reference to illustrative Examples, but the scope of the present invention should not be limited thereto.

EXAMPLES 1 TO 4

At first, powders of $BaCO_3$, $Y_2O_3$, and $CuO$ having a purity of more than 3N and an average particle size of 3 μm are mixed uniformly in such proportions that the value of "x" and "y" in the formula:

$(Ba_{1-x}Y_x)Cu_yO_z$ becomes equal to x=0.6 and y=1.0 and 0.5 respectively.

The powder mixture is sintered preliminertly at 920° C. for 12 hours in air to obtain a cake-like solid mass of preliminary sintered body. Then, the solid mass is pulverized in a molter and then by means of alumina balls in a ball mill for 5 hours to prepare a powder having an average particle size of 5 μm. The same procedure as the abovementioned combination of preliminary sintering and pulverization is repeated for three times.

The resulting preliminertly sintered powder is then compacted in a rubber mold under a pressure of 0.5 ton/cm² statically to obtain a compact having a size of 30ø×50 mm. A sample having a thickness of 1.2 mm, a width of 5 mm and a length of 20 mm is cut from the compact and is sintered finally at 930° C. for 12 hours in $O_2$ to obtain a shaped and sintered body having the relative density of from 40 to 50% and consisting of perovskite type or quasi-perovskite type oxide.

The sintered body is then subjected to degassing operation at a reduced pressure of lower than $10^{-1}$ Torr and the vapor of platinum (Pt) is introduced into the chamber, so that outer and interior surface of pores of the sintered body is coated with platinum film. After then, the resulting body is immersed in molten copper bath to be impregnated with copper under pressure.

The products thus obtained contains the copper metal phase of volumetric percentage of from 40 to 50 % in the sintered body as is shown in Table 1 in which the results are summarized.

TABLE 1

| Sample No. | Elements | Atomic Ratio (y) | Metal Phase | Volume (%) of Metal | Tc (K) | Tcf (K) |
| --- | --- | --- | --- | --- | --- | --- |
| 1 | Ba-Y | 1 | Cu | 40 | 100 | 96 |
| 2 | Ba-Y | 0.5 | Cu | 50 | 97 | 94 |
| 3 | Ba-Y | 1 | Ag | 40 | 102 | 99 |
| 4 | Ba-Y | 0.5 | Ag | 50 | 95 | 79 |

EXAMPLES 5 TO 10

At first, powders of $BaCO_3$, $Y_2O_3$, and CuO having a purity of more than 3N and an average particle size of 3 μm are mixed uniformly in such proportions that the value of "x" and "y" in the formula:

$(Ba_{1-x}Y_x)Cu_yO_z$ becomes equal to x=0.4 to 0.6 and y=1.0 and 0.5 respectively.

The powder mixture is sintered preliminarily at 920° C. for 12 hours in air to obtain a cake-like solid mass of preliminary sintered body. Then, the solid mass is pulverized in a molter and then by means of alumina balls in a ball mill for 5 hours to prepare a powder having an average particle size of 5 μm. The same procedure as the abovementioned combination of preliminary sintering and pulverization is repeated for three times.

A powder of electrolytic copper having a particle size of 325 mesh and a purity of more than 3N is admixed uniformly with the pulverized powders.

Then, the resulting powder mixture is compacted in a rubber mold under a pressure of 0.5 ton/cm² statically to obtain a compact having a size of 30ø×50 mm. Each sample having a thickness of 1.2 mm, width of 5 mm and a length of 20 mm is cut from the compact and is sintered finally at 920° to 940° C. for 12 hours in $O_2$ to obtain a shaped and sintered body.

The products thus obtained contains the copper metal phase of volumetric percentage which is shown in Table 1 in which the results of the other examples using Gd and Yb in place of Y are also summarized.

TABLE 2

| Sample No. | Elements | Atomic Ratio (x) | Atomic Ratio (y) | Metal Phase | Volume (%) of Metal | Sintering Temp. (°C.) | Tc (K) | Tcf (K) |
| --- | --- | --- | --- | --- | --- | --- | --- | --- |
| 5 | Ba-Y | 0.6 | 1 | Cu | 40 | 930 | 105 | 85 |
| 6 | Ba-Y | 0.4 | 0.5 | Cu | 40 | 930 | 95 | 82 |
| 7 | Ba-Y | 0.6 | 1 | Ag | 30 | 920 | 106 | 90 |
| 8 | Ba-Y | 0.4 | 0.5 | Ag | 20 | 920 | 108 | 88 |
| 9 | Ba-Gd | 0.6 | 1 | Cu | 40 | 930 | 88 | 75 |
| 10 | Ba-Yb | 0.4 | 1 | Cu | 30 | 940 | 87 | 76 |

EXAMPLES 11 TO 13

At first, powders of $BaCO_3$, $Y_2O_3$, and CuO having a purity of more than 3N and an average particle size of 3 mm are mixed uniformly in such proportions that the value of "x" and "y" in the formula:

$(Ba_{1-x}Y_x)Cu_yO_z$ becomes equal to x=0.4 to 0.6 and y=1.0 and 0.5 respectively.

All of the powder mixture are sintered preliminarily at 920° C. for 12 hours in air to obtain a cake-like solid mass of preliminary sintered body. Then, the solid mass is pulverized in a molter and then by means of alumina balls in a ball mill for 5 hours to prepare a powder having an average particle size of 5 μm. The same procedure as the abovementioned combination of preliminary sintering and pulverization is repeated for three times.

The resulting preliminarily sintered powder is then compacted in a rubber mold under a pressure of 0.5 ton/cm² statically to obtain a compact having a size of 30×50 mm. A sample having a thickness of 1.2 mm, width of 5 mm and a length of 20 mm is cut from the compact and is sintered finally at 930° to 940° C. for 12 hours in $O_2$ to obtain a shaped and sintered body.

The sintered body is placed in oxygen atmosphere in a chamber then the partial pressure of oxygen is reduced gradually to perform degassing operation. After then, the resulting body is immersed in molten metal bath to be Impregnated with metal and the pressure is increase to 10 atm.

The products thus obtained contains the metal phase in the sintered body as is shown in Table 3 in which the results are summarized.

TABLE 3

| Sample No. | Elements | Atomic Ratio (x) | Atomic Ratio (y) | Metalic Phase | Volume (%) of Metal | Sintering Temp. (°C.) | Tc (K) | Tcf (K) |
|---|---|---|---|---|---|---|---|---|
| 11 | Ba-Y | 0.6 | 1 | Cu | 40 | 940 | 103 | 90 |
| 12 | Ba-Y | 0.6 | 0.5 | Cu | 30 | 930 | 105 | 86 |
| 13 | Sr-La | 0.4 | 1 | Ag | 50 | 930 | 75 | 69 |

What we claimed are:

1. A process for producing a superconducting composite comprising a superconducting sintered mass composed of perovskite or quasi-perovskite oxide represented by one of the following general formula (I) or (II):

$$Y_a Ba_{1-a} Cu_y O_z \quad (I)$$

$$La_a Sr_{1-a} Cu_y O_z \quad (II)$$

wherein a is 0.4–0.6 and y is 0.5–1 in Formula I and a is 0.4 and y is 1 in Formula II, and "z" represents a number which is selected from a range of from 1 to 5, and a metal phase dispersed in said superconducting mass with a proportion of from 10 to 70 volume % in the composite, the metal of the metal phase possessing higher heat-conductivity and higher specific heat than the surrounding sintered mass;

said process comprising the steps of:

preparing a powder mixture comprising a powder of oxide or carbonate of Sr or Ba, a powder of oxide or carbonate of La or Y and a powder of oxide or carbonate of Cu in such proportions that the atom ratio of said elements "Sr or Ba":"La or Y":Cu is adjusted to that defined in Formulae I and II, subjecting the powder mixture to preliminary sintering, pulverizing a preliminary sintered mass, admixing metal powder with the resulting pulverized powder, compacting the resulting metal-containing powder mixture into a shaped body, and subjecting the shaped body to the final sintering to producing a superconducting composite comprising a metal phase dispersed in a superconducting material.

2. The process set forth in claim 1, wherein said metal phase consist of at least one of Cu, Ag, Au, Pt, Ni, Zn and their alloys.

3. The process set forth in claim 1, wherein said final sintering is carried out at a temperature ranging from 800° C. to 1,100° C.

4. The process set forth in claim 1, wherein said preliminary sintering is carried out at a temperature ranging from 700° C. to 900° C.

5. The process set forth in claim 1, wherein the steps of preliminary sintering and pulverization are repeated for at least three times.

6. The process set forth in claim 1, wherein a preliminary sintered mass is pulverized into a powder having an average particle size of less than 8 μm.

7. A process for producing a superconducting composite comprising a superconducting sintered mass composed of perovskite or quasi-perovskite oxide represented by one of following general formula (I) or (II):

$$Y_a Ba_{1-a} Cu_y O_z \quad (I)$$

$$La_a Sr_{1-a} Cu_y O_z \quad (II)$$

wherein a is 0.4–0.6 and y is 0.5–1 in Formula I and a is 0.4 and y is 1 in Formula II, and "z" represents a number which is selected from a range of from 1 to 5, and a metal phase dispersed in said superconducting mass with a proportion of from 10 to 70 volume % in the composite, the metal of the metal phase possessing higher heat-conductivity and higher specific heat than the surrounding sintered mass;

said process comprising the steps of:

preparing a powder mixture comprising a powder of oxide or carbonate of Sr or Ba, a powder of oxide or carbonate of La or Y and a powder of oxide or carbonate of Cu in such proportions that the atom ratio of said elements "Sr or Ba":"La or Y":Cu is adjusted to that defined in Formulae I and II, subjecting the powder mixture to preliminary sintering, pulverizing a preliminary sintered mass, compacting the resulting pulverized powder into a shaped porous body, subjecting said shaped porous body to the final sintering, and then dipping said sintered shaped porous body in molten metal so that a matrix of said sintered porous shaped body is impregnated with the metal.

8. The process set forth in claim 7 wherein said metal phase consist of at least one of Cu, Ag, Au, Pt, Ni, Zn and their alloys.

9. The process set forth in claim 7 wherein the surface of the matrix of the sintered shaped body is coated with a film of platinum (Pt) vacuum deposited thereon previously before the sintered shaped is dipped in the molten metal.

10. The process set forth in claim 7 wherein said final sintering is carried out at a temperature ranging from 800° C. to 1,100° C.

11. The process set forth in claim 7 wherein said preliminary sintering is carried out at a temperature ranging from 700° C. to 900° C.

12. The process set forth in claim 7 wherein the steps of preliminary sintering and pulverization are repeated for at least three times.

* * * * *